US009059628B2

(12) United States Patent
Mian et al.

(10) Patent No.: US 9,059,628 B2
(45) Date of Patent: Jun. 16, 2015

(54) ENERGY HARVESTING (71) Applicants: Zahid F. Mian, Loudonville, NY (US);
Ronald W Gamache, East Greenbush,
NY (US); Ryk E Spoor, Troy, NY (US)

(72) Inventors: Zahid F. Mian, Loudonville, NY (US);
Ronald W Gamache, East Greenbush,
NY (US); Ryk E Spoor, Troy, NY (US)

(73) Assignee: International Electronic Machines Corp., Troy, NY (US)

( * ) Notice: Subject to any disclaimer, the term of this patent is extended or adjusted under 35 U.S.C. 154(b) by 6 days.

(21) Appl. No.: 13/773,571

(22) Filed: Feb. 21, 2013

(65) Prior Publication Data
US 2013/0221680 A1 Aug. 29, 2013

Related U.S. Application Data (60) Provisional application No. 61/633,986, filed on Feb. 22, 2012.

(51) Int. Cl.
F02B 63/04 (2006.01)
H02K 99/00 (2014.01)
H02K 35/02 (2006.01)
H02K 35/04 (2006.01)
H02K 7/18 (2006.01)

(52) U.S. Cl.
CPC .............. H02K 57/003 (2013.01); H02K 35/02 (2013.01); H02K 35/04 (2013.01); H02K 7/1846 (2013.01); H02K 7/1853 (2013.01); H01L 2924/0002 (2013.01)

(58) Field of Classification Search
USPC ......................................... 200/1 R; 310/75 R
See application file for complete search history.

(56) References Cited

U.S. PATENT DOCUMENTS

| 4,088,852 | A  | * | 5/1978 | Van Doren ................ 200/1 R |
| 4,405,872 | A  | * | 9/1983 | Thomas ..................... 310/75 R |
| 7,009,310 | B2 | * | 3/2006 | Cheung et al. ............. 290/1 R |
| 7,652,386 | B2 |   | 1/2010 | Donelan et al. |
| 7,667,375 | B2 |   | 2/2010 | Berkcan et al. |
| 7,812,183 | B2 |   | 10/2010 | Zhang et al. |
| 7,936,109 | B1 |   | 5/2011 | Gao et al. |
| 7,977,852 | B2 |   | 7/2011 | Ward et al. |
| 7,986,076 | B2 |   | 7/2011 | Yoon et al. |
| 8,030,807 | B2 |   | 10/2011 | Gieras et al. |
| 8,212,436 | B2 |   | 7/2012 | Nair et al. |
| 2006/0076461 | A1 |   | 4/2006 | DeRose et al. |
| 2009/0256361 | A1 |   | 10/2009 | Theuss et al. |
| 2009/0300379 | A1 |   | 12/2009 | Mian et al. |
| 2010/0194117 | A1 |   | 8/2010 | Pabon et al. |
| 2010/0289271 | A1 |   | 11/2010 | DiMauro et al. |
| 2011/0140458 | A1 |   | 6/2011 | Arnold et al. |
| 2011/0309618 | A1 |   | 12/2011 | Gieras et al. |

OTHER PUBLICATIONS

Linear Technology—News Release RE: LTC3109—Jun. 7, 2010.*

(Continued)

*Primary Examiner* — Vanessa Girardi
(74) *Attorney, Agent, or Firm* — LaBatt, LLC (57) ABSTRACT A solution for harvesting energy from motion resulting from operation of an object, such as a vehicle, is provided. The motion can comprise low-frequency motion. The solution can include at least one magnet, at least one coil, a magnet supporting structure, a coil supporting structure, and a design component which provides a restoring force to at least one of: the magnet supporting structure or the coil supporting structure so as to ensure relative motion between the magnet(s) and coil(s). The relative motion of the magnet(s) and coil(s) generate energy which can be harvested for wireless monitoring or other purposes.

21 Claims, 6 Drawing Sheets

(56) References Cited

OTHER PUBLICATIONS

Park, International Search Report and Written Opinion for International Application No. PCT/US2013/027196, Jun. 25, 2013, 10 pages.

Wang, Yu-Jen, Chen, Chung-De, and Sung, Cheng-Kuo. "System Design of a Weighted-Pendulum-Type Electromagnetic Generator for Harvesting Energy From a Rotating Wheel." to be published in IEEE/ASME Transactions on Mechatronics, Apr. 2013, pp. 754-763, vol. 18, No. 2, downloaded from ieeexplore.ieee.org on Feb. 14, 2013.

* cited by examiner

ENERGY HARVESTING

REFERENCE TO PRIOR APPLICATIONS

The current application claims the benefit of U.S. Provisional Application No. 61/633,986, titled "Non intrusive wireless energy harvesting railcar diagnostic sensing node", which was filed on 22 Feb. 2012, and which is hereby incorporated by reference.

TECHNICAL FIELD

The disclosure relates generally to power harvesting, and in particular to a new and innovative device and method for harvesting power from the motion of an object, such as a vehicle.

BACKGROUND ART

Wireless sensor systems are becoming increasingly important for multiple applications ranging from security to predictive and condition-based maintenance in a wide variety of applications. Vehicles form one class of systems of particular interest for such monitoring, as they of necessity include many components which are subject to motion, wear, and stress during operation.

Such wireless sensor systems require a source of power. Providing a wired power source significantly reduces the utility of most wireless monitoring applications, while batteries will eventually become exhausted and need to be replaced; this represents significant time and effort and may be very difficult to impossible in some wireless sensor settings (for instance, if a wireless sensor is to be embedded in a component to provide lifetime monitoring). Power harvesting—deriving energy for the sensor from some aspect of the sensor's environment—has thus been of considerable interest to the industry.

Multiple sources of energy may be harvested; in open areas exposed to the sun, photovoltaic (solar) energy harvesting is of considerable use. Some applications can harvest heat energy from associated systems, or use wind energy. However, for vehicles and other operating mechanical systems, vibration and motion energy represent the most likely and commonly considered source.

A considerable body of prior art is devoted to devising various means for harvesting this energy. In U.S. Pat. No. 7,009,310 B2, Cheung et al describe an autonomous power source consisting of a coil with a magnet in a low-friction ferrofluidic bearing which permits the magnet to move along a straight or curved tube with respect to the coil, thus generating electrical energy. In U.S. Pat. No. 7,652,386 B2, Donelan et al describe methods for harvesting energy from the movement of joints, based on the relative motion of the components of a biological system (e.g., the motion of the knee joint). In U.S. Pat. No. 7,667,375 B2, Berkcan et al describe a harvesting system comprised of cantilevers of varying resonant lengths which generate energy through vibration by piezoelectric transduction. Rastegar, in U.S. Pat. No. 7,821,183 B2, describes a system which uses motion of some mass to in turn excite cantilevered piezoelectric beams which generate electrical energy. Gao et al, in U.S. Pat. No. 7,936,109 B1, describe another method in which a piezoelectric element on a bendable substrate collides with a housing through which it moves, thereby generating energy. In U.S. Pat. No. 7,977,852 B2, Ward et al describe a method and system for using characteristics of the energy source to vary parameters of the harvesting arrangement to achieve a greater efficiency of energy harvesting. In U.S. Pat. No. 7,986,076 B2, Yoon et al describe a piezoelectric harvesting method which uses a low-frequency impact to generate power. Gieras et al, in U.S. Pat. No. 8,030,807 B2 describe an electromagnetic harvesting system in which a magnet on a cantilever may move relative to a fixed coil and thus generate electrical energy. Nair et al, in U.S. Pat. No. 8,212,436 B2, describe a method for power harvesting using magnetomotive forces in magnetic materials to produce power.

SUMMARY OF THE INVENTION

Despite this body of work, the inventors recognize that there still exists a dearth of technological innovation in the area of non-resonance dependent, low-frequency power harvesting, especially for the power regime between a few hundred microwatts and roughly ten milliwatts; this has been a sort of no-man's land which is too high power to be practical for micro electro-mechanical systems (MEMS) and smaller-scale devices, and too low power for traditional wireless sensing devices which have average power draws in the tens or hundreds of milliwatts. However, the inventors have demonstrated that useful wireless monitoring of vehicles of various sorts for condition-based maintenance and other applications can be performed in the single-digit milliwatt range.

An embodiment of the current invention provides a non-resonance dependent, widely applicable solution to harvest milliwatt-scale energy in a broad range of frequencies, including those in the fractional hertz range, which may be found on various vehicles including but not limited to train cars, trucks, and ocean-going vessels.

The current invention can address one or more limitations of the described prior art to provide a reliable, broad-band solution for maintaining a power supply for a wireless system or other system which requires a reliable low-power supply, or which will very intermittently use much more power but recharge slowly in the intervening time.

Aspects of the invention can provide improvement in capability and can result in the harvesting of energy on the order of a milliwatt or so from various types of movement in vehicular or other similar settings. The energy can be harvested in a non-resonance dependent manner and may harvest energy across a broad spectrum of vibrations and oscillations.

Aspects of the invention provide an improved device and method for harvesting energy from movement of an object, such as a vehicle. A first aspect of the invention provides a device for energy harvesting from motion of an object, the device comprising: at least one magnet; at least one coil; a magnet supporting structure supporting the at least one magnet; a coil supporting structure supporting the at least one coil, wherein the magnet supporting structure and the coil supporting structure enable movement of the at least one magnet relative to the at least one coil during operation of the object, and wherein at least one of the magnet supporting structure or the coil supporting structure is configured to be affixed to the object; and means for providing a restoring force to at least one of: the magnet supporting structure or the coil supporting structure. Various electronics may be attached to the coil or coils to store or make use of the energy generated from the device.

A second aspect of the invention provides a method for energy harvesting comprising: moving a magnet supporting structure with respect to a coil supporting structure based on motion of an object to which the coil supporting structure is affixed, wherein at least one of the magnet supporting structure or the coil supporting structure is configured to provide a restoring force to maintain a relative difference in motion between the magnet supporting structure and the coil supporting structure without regard to resonant phenomena; and generating electrical energy based on the relative motion between at least one magnet corresponding to the magnet supporting structure and at least one coil corresponding to the coil supporting structure.

A third aspect of the invention provides a vehicle including: a device for energy harvesting from motion of the vehicle, the device comprising: at least one magnet; at least one coil; a magnet supporting structure supporting the at least one magnet; a coil supporting structure supporting the at least one coil, wherein the magnet supporting structure and the coil supporting structure enable movement of the at least one magnet relative to the at least one coil during operation of the vehicle, and wherein at least one of the magnet supporting structure or the coil supporting structure is affixed to the vehicle; and means for providing a restoring force to at least one of: the magnet supporting structure or the coil supporting structure.

The illustrative aspects of the invention are designed to solve one or more of the problems herein described and/or one or more other problems not discussed.

BRIEF DESCRIPTION OF THE DRAWINGS

These and other features of this invention will be more readily understood from the following detailed description of the various aspects of the invention taken in conjunction with the accompanying drawings in which:

FIG. 1 shows a view of an illustrative device according to an embodiment of the invention in basic concept.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As described herein, aspects of the invention provide a device comprising at least one magnet, at least one coil, at least one magnet containing or holding structure, at least one coil containing or holding structure, and a component or design element to provide a restoring force to either the magnet containing or holding structure or the coil containing or holding structure. Various electronics may be attached to the coil or coils to store or make use of the energy generated from the device.

Further aspects of the invention provide a method comprising moving a magnet-containing or holding structure with respect to a coil containing or holding structure, the movement caused by a response by the magnet-containing or holding structure which can be in a non-resonance dependent manner to excitation (e.g., motion) of an object or structure to which the device is attached; the response can operate over a wide range of frequencies and amplitudes, and the movement thereby can cause the generation of electrical current in the coils through the interaction of the magnetic field with the coils; and the magnet containing or holding structure can have a tendency to return to a base position or state due to a restoring force which is present due to a particular design element of the structure.

It should be noted that the coil containing or holding structure could be the structure to move and be subjected to the restoring force. However, in this case, as the actual electrical energy is generated within the coils and is thus to be transferred to whatever storage devices or electrical systems which will make use of the energy, connections which would either move with the coil-containing or holding structure or be able to transfer the electrical power from a moving object—e.g., slip rings or a continuous electrical contact or similar arrangements, would be required. At the low voltages and power levels anticipated for this design, such connections may either introduce significant potential physical damping (e.g., from connected wires that would have to be bent or moved with the coils) and/or points of failure from these connections, or may introduce additional contact resistance and friction issues. Further aspects of the invention are described in conjunction with a device in which the magnet containing or holding structure is the component which is free to move relative to the coils. In some frames of reference, the coils may move relative to the magnet, but the electrical connections and vehicle or object to which the entire device is attached will be stationary with respect to the coils.

An illustrative embodiment of the invention is shown in FIG. 1, and can harvest energy from the motion of a vehicle, such as a railroad car.

Figure 1A:
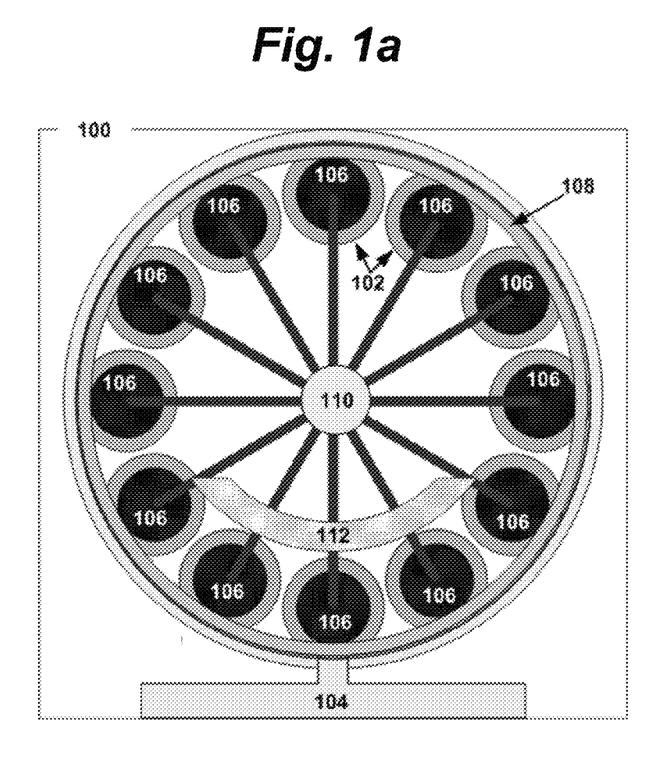
FIG. 1a shows a front view of the device and FIG. 1b shows a side view of the device.
Figure 1B:
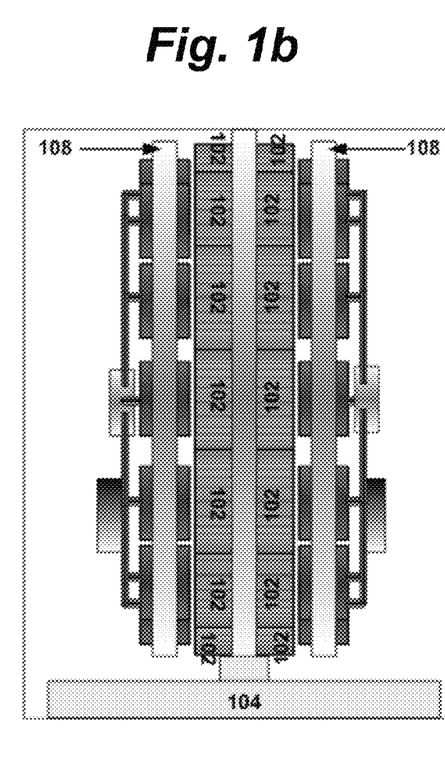

FIGS. 1a and 1b show an illustrative energy-harvesting device 100 according to an embodiment. The device 100 is comprised of harvesting coils 102, which are affixed to a coil supporting structure (coil framework) 104. Additionally, a set of magnets 106 is attached to a separate magnet supporting structure (magnet framework) 108, which is supported by a hub 110. In an embodiment, the coil framework 104 is pivotally attached to the magnet framework 108. For example, hub 110 includes a bearing which allows the framework 108 to rotate with respect to coil framework 104. Attached to the framework 108 is a weight 112. Weight 112 provides a restoring force for any force that attempts to rotate the magnet framework 108 with respect to the coil framework 104.

In any event, when coil framework 104 is affixed to an object, such as a vehicle, which oscillates in the plane of the coil framework 104 and magnet framework 108 during operation, the coil framework 104 will oscillate along with the object to which it is attached. However, the magnet framework 108 is free to rotate in this plane, and due to inertia will tend to remain in its original orientation throughout the object's oscillations, modulo the slight force transmitted to magnet framework 108 through the bearing of hub 110. However, this slight force will be opposed by the restoring force of weight 112; this will minimize any motion of magnet framework 108. The net effect, then, is that the magnets 106 move with respect to the coils 102 with any oscillation of the object and thus coil framework 104. As is well known, movement of a magnet with respect to a coil will generate an electrical current, ϵ, according to Faraday's Law:

$$\epsilon = -N d\phi/dt$$

where ϕ is the flux density and N is the number of turns in the coils 102. For the case of a magnet moving transverse to a coil, an equation ϵ=B*dA/dt, where A is the cross section area of the coil and B is the magnetic field (which is assumed to be uniform in this equation) can be used. This assumption is good for coils with large area and negligible length. For other embodiments, other equations corresponding to Faraday's Law can be used based on the geometry and motion details as will be recognized by one skilled in the art. The designs of the rotor or framework 104 (e.g., the number of coils 102, the number of turns in coils 102, and/or the like) and/or the stator or framework 108 (e.g., the strength of magnets 106, geometry of the framework 108, and/or the like) can be adjusted to produce a desired amount of power to accomplish the desired amount of power using the available relative motion present during operation of the object.

With high-strength magnets 106 (for example, NdFeB magnets) and a sufficient number of windings in coils 102, even slow (~1 Hz) oscillations of only a few degrees can produce a net power from device 100 on the order of a milliwatt or more.

This operation is contingent on the use of modern electronics; prior designs based on, for example, diodes were limited to harvesting electrical potentials of several hundred millivolts or more. However, harvester power conditioning systems for low voltage inputs, such as Cymbet's "EnerChip™" systems or those offered by Advanced Linear Devices, permit effective collection and harvesting of energy from potentials as low as tens of millivolts and a few hundred nanoamps, which makes harvesting at very low voltages practical.

In any event, use of a design element that provides a restoring force to preserve the relative position of one component of the device 100 while the other component is free to move as an electromagnetic generation-based approach can be vastly more efficient than any approach using piezoelectric methods, as piezoelectric harvesting methods have inherently low efficiency. For example, maximum practical efficiencies at resonance for currently available piezoelectric materials peak at under 0.2 (less than 20 percent conversion efficiency), while without resonance their efficiencies are drastically lower. While some recent developments have claimed much higher efficiencies in the laboratory, no such materials are available for general use and may prove to be impractical in the real world. In contrast, electromagnetic generation can easily exceed 50-60 percent and for large generators has significantly exceeded 90 percent.

An embodiment of the designs and approaches described herein can cover oscillation ranges from near-zero (e.g., small fractional Hz, very long-wave motion) and up to ten or twenty Hertz. An ability to operate at such oscillation ranges can enable use of the device on large vehicles, whose general oscillations in most dimensions can be between 0.25 Hz and 3-4 Hz. In a rail vehicle, water-going vessel, large aircraft, and/or the like, the coils can be designed as larger annular shapes, which can maximize the dB/dt*(a term that increases power generation); the design element which produces restoring force also can be significantly larger or more effective in order to prevent the action of generating power from reducing or stopping the relative motion of the magnets and coils due to Lorentz forces.

The illustrative embodiment of the invention described herein is not limited to the specific form of the preferred embodiment, but can be instantiated in many different forms as will be recognized by one skilled in the art. Following are some additional illustrative examples of other embodiments.

Figure 2:
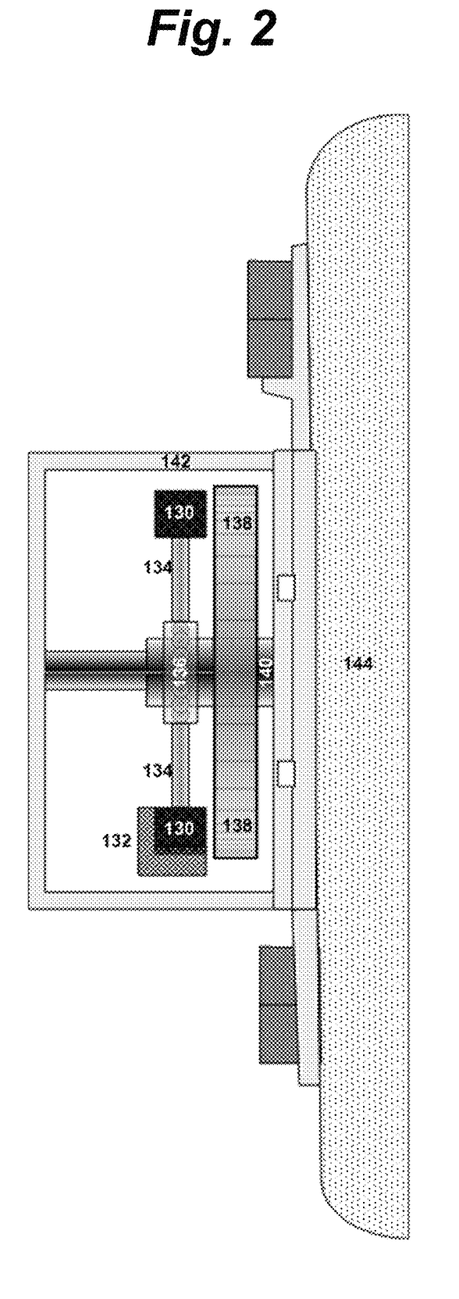
FIG. 2 shows a conceptual diagram of an illustrative device according to a second embodiment of the invention for use, for example, on the hub of a railroad car.

In one alternate embodiment, a device is designed to fit on the end of a rotating shaft of an object/structure; for example, the axle of a railcar. FIG. 2 illustrates one conceptual design for such a device. In FIG. 2, magnets 130 and a weight 132 are affixed to a support structure 134 that is itself attached to a low-friction bearing 136 which allows the weight 132 to keep the support structure 134 in its same general orientation even if the remainder of the device is rotating. A set of coils 138 are affixed to a shaft 140; the bearing 136 surrounds the shaft 140. The entire device is enclosed within a housing 142 which can protect the device from environmental and physical stresses and which may also contain the electronics which will make use of the generated power. The housing 142 can be affixed to the end of the axle 144. Thus, when axle 144 rotates, the housing 142 and all components within also rotate at the same rate, except for the magnet support structure 134 which is generally maintained in a constant orientation by the weight 132 and the turning of the low-friction bearing 136. Because of this maintained orientation, the coils 138 rotate relative to the magnets and thus generate electrical power.

Figure 3A:
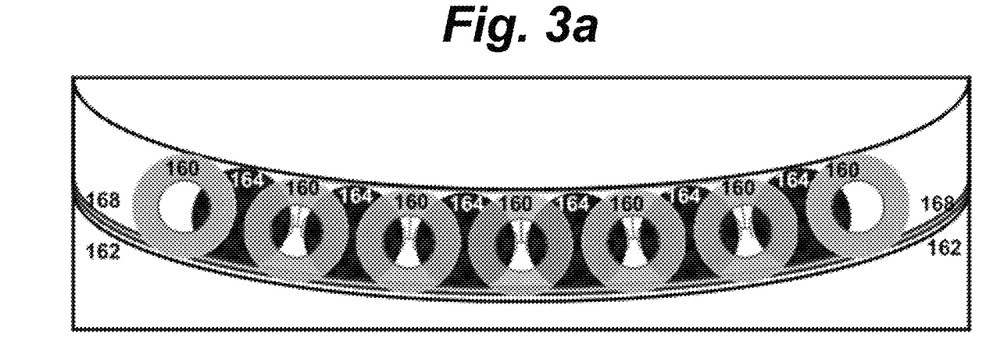
FIGS. 3a and 3b show a conceptual diagram of an illustrative device according to a third embodiment of the invention for use in harvesting energy from long-period motions.
Figure 3B:
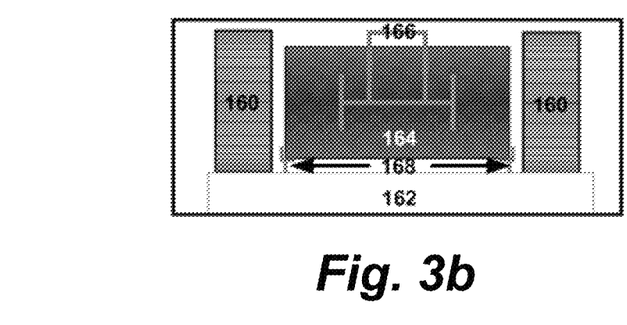

Another alternative embodiment includes a device intended to harvest the motion of a slowly (e.g., two Hz or less) swaying object, such as a railcar on a track. A conceptual version of this embodiment is shown in FIG. 3a and FIG. 3b. A set of coils 160 are spaced along the sides of an enclosure 162. The bottom of the enclosure 162 is curved up at both ends and the coils 160 follow the curve; the enclosure 162 can serve both as rugged protection for the device (and potentially for any electronics associated with the device) and as support for the various components of the device. A set of magnets 164 are within the enclosure 162; the magnets 164 are cylindrical in this embodiment although other shapes such as a sphere may be used in a similar design. The magnets 164 can be sized and spaced such that their spacing and overall cross-sectional size generally corresponds with that of the coils 160. The spacing can be maintained by a bearing frame 166 which allows the magnets 164 to roll with minimal impediment but prevents the magnets 164 from impacting with or sticking to each other. The magnets 164 can roll on a track or rail 168 which is attached to the enclosure 162, and which can be located at a height which will cause the magnets 164 to roll along the centerlines of the coils 160. As the object to which the enclosure 162 is attached sways, the magnets 164 roll up and down the curved rails 168, moving relative to the coils 160 and generating electrical power. Note that in this embodiment, the design element providing the restoring force is the curved portion of the enclosure 162 rather than a weight as in other embodiments.

Figure 4:
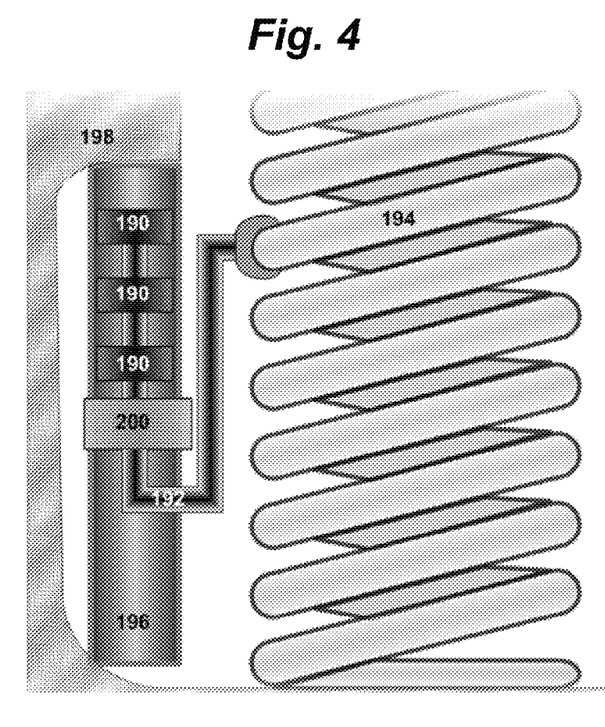
FIG. 4 shows a conceptual diagram of an illustrative device according to a fourth embodiment of the invention for use, for example, in harvesting energy from the suspension of a vehicle.

Another embodiment of the invention involves attaching the magnet and coil components to different portions of an object, such as a vehicle, which undergo relative motion; for example, the spring and supports of a suspension. This concept is illustrated by FIG. 4. In FIG. 4, magnets 190 are spaced along a support 192. Support 192 is attached to the spring 194 of the vehicle (e.g., a railcar) suspension. The magnets ride within an enclosure 196, which has a slit or other means to allow the support 192 to move up and down relative to the enclosure 196 which is affixed to vehicle support structure 198. A coil or coils 200 are either part of, or placed immediately surrounding, enclosure 196. During operation of the vehicle, the spring 194 is compressed and released as the vehicle travels, dependent on load, smoothness of surface (e.g., track, road, or the like), rocking of the vehicle, and other factors. Compression of the spring 194 causes the magnet support 192 to drop relative to the enclosure 196, while relaxation or release of the spring 194 causes the support 192 to rise relative to the enclosure 196. During installation, a level of the attachment of the support 192 to the spring 194 can be selected such that a minimum load of the vehicle will place the support 192 at or below the maximum allowable travel along the slit in enclosure 196. In this embodiment of the invention, the restoring force is provided by the separation of the two key components to attachments with external components which have a limited and known mobility with respect to each other.

Figure 5A:
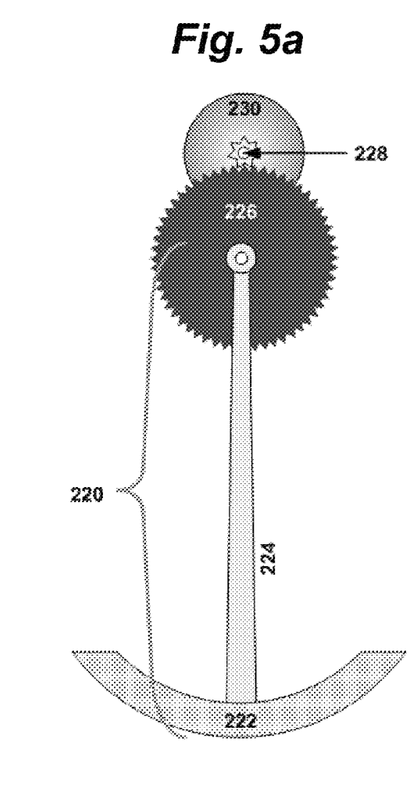
FIGS. 5a and 5b show a conceptual diagram of an illustrative device according to a fifth embodiment of the invention which provides a means to increase the voltage and potentially overall power harvested by the device.
Figure 5B:
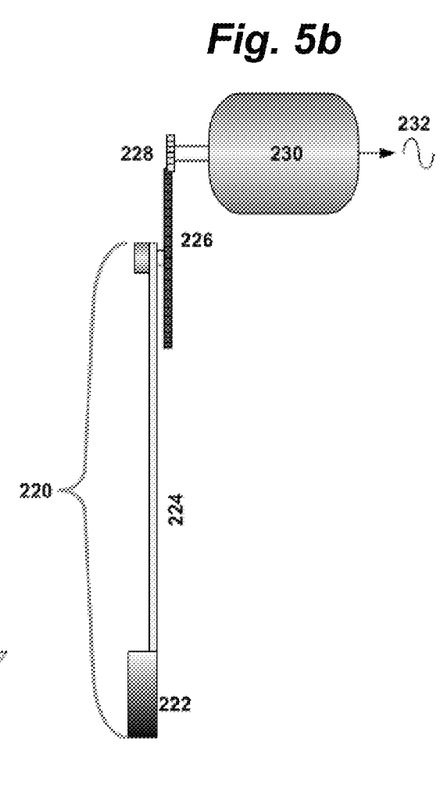

Another embodiment of the invention makes use of modern miniature generators, which in themselves comprise the magnet, coil, and magnet and coil containing and holding structures as described herein. FIGS. 5a and 5b show a conceptual diagram of this embodiment of the invention. A pendulum 220 comprised of a weight 222 and an arm 224 is attached to a large gear 226. Large gear 226 meshes with a small gear 228. By virtue of the difference in size, the movement of large gear 226 along some fraction of an arc is translated into multiple revolutions of small gear 228. Small gear 228 is attached to the shaft of miniature generator 230, causing the rotor of the generator 230 to turn. It can thus be seen that the weighted pendulum is the design element providing the restoring force of the presented invention. The multiple revolutions of the generator 230 generate a significant alternating current 232. This approach addresses one of the challenges of the invention which is that low-speed movement of magnets past coils tends to generate very low voltages and currents. While these can be harvested, as noted previously, many more devices exist to harvest higher voltages and currents; by using various gearing methods to increase the effective speed of the magnets past their respective coils, much higher voltages and currents can be generated, in accordance with Faraday's Law as discussed. Note that FIGS. 5a and 5b are conceptual only and that many other arrangements to increase the relative rotational speed can be envisioned by those skilled in the art. For example, in the configuration shown, the swinging pendulum will cause the shaft of the generator 230 to rotate in both directions. For applications in which rotation in only a single direction is desired, the system can include a ratchet and gear mechanism to keep the generator 230 rotating in only one direction.

Figure 6:
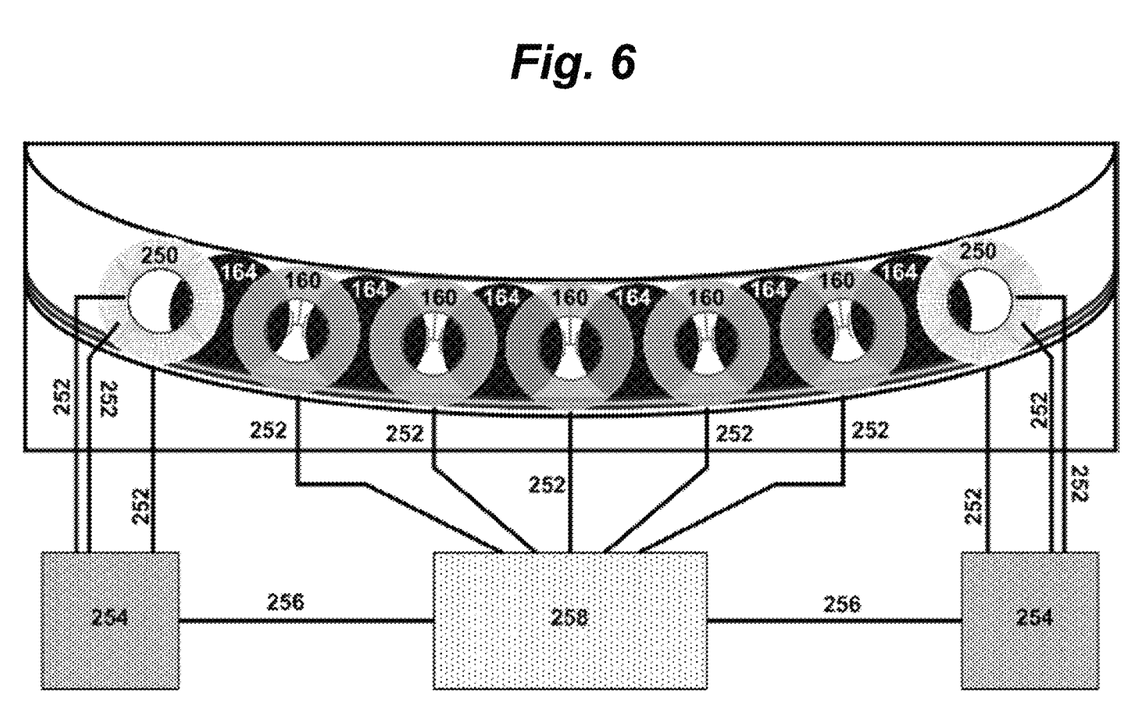
FIG. 6 shows a conceptual diagram of an illustrative method to control behavior of an energy harvesting device under different levels of excitation according to an embodiment.

Excitation of the various embodiments of the invention described herein can produce more or less oscillation of the relevant components. FIG. 6 shows a method whereby the extent and velocity of that oscillation can be controlled both to address any incidental resonances and to promote longer or shorter "strokes" under minimal or excessive excitation. FIG. 6 uses the rolling-based harvester embodiment described herein in conjunction with FIGS. 3a and 3b as an illustrative basis for discussion. In this embodiment, most of the coils 160 remain unchanged, as do the magnets 164. However, in this embodiment some coils 250 are modified to permit some number (in this case three) of different connections 252; the coils 250 may also have additional turns or other modifications. These different connections 252 connect to different numbers of turns of the coil, effectively changing its inductance depending on which of the connections 252 are used. The other coils 160 can have a single set of connections using the entire set of turns of each coil. In any event, as the magnets 164 move past the coils 160 or 250, Lorentz forces are exerted on the magnets 164 depending on the strength of the magnetic field and the inductance of the coils 160 or 250. Thus, by selecting the appropriate inductance of the coils 250, the Lorentz forces experienced by the magnets 164 can be changed—increased or decreased.

The coil connections 252 from the coils 250 can be connected to an extremely low-power switching device 254. The energy from coils 250 is transmitted via connections 256 to the power harvesting controller 258; in addition, the unmodified coils 160 can have their connections 252 connected to the power harvesting controller 258. The controller 258 may comprise multiple components such as a very low voltage power scavenging chip, a very low power microcontroller, an energy storage component, and so on. In an embodiment, the controller 258 includes a rectification component, which can store electrical energy regardless of polarity. Furthermore, the controller 258 can include components/devices capable of rectifying and storing electrical energy at very low voltages.

In any event, the controller 258 can be configured to monitor the output voltages from the coils 160 and 250, and calculate the motion of the magnets 164. If the magnets 164 appear to be moving too swiftly (and thus in danger of hitting the walls of the enclosure), the modified coils 250 may be directed by the controller 258 to be switched via the switching device 254 to a higher impedance condition which will tend to exert more Lorentz forces upon the magnets 164, thereby slowing them. Conversely, if the magnets 164 are moving at a minimal speed, the controller 258 can switch the impedance of the coils 250 to a lower impedance to provide less resistance to the roll of the magnets 164. It should be noted that there are other methods to vary the impedance known to those skilled in the art, and any such methods may be used in this embodiment of the invention. Additionally, a similar approach may be used in other embodiments of the invention.

The foregoing description of various embodiments of this invention has been presented for purposes of illustration and description. It is not intended to be exhaustive or to limit the invention to the precise form disclosed and inherently many more modifications and variations are possible. All such modifications and variations that may be apparent to persons skilled in the art that are exposed to the concepts described herein or in the actual work product, are intended to be included within the scope of this invention disclosure.

What is claimed is:

1. A device for energy harvesting from motion of an object, the device comprising:
   at least one magnet;
   at least one coil;
   a magnet supporting structure supporting the at least one magnet;
   a coil supporting structure supporting the at least one coil, wherein the magnet supporting structure and the coil supporting structure have a fixed relative orientation when the object is not in operation and enable relative movement between the at least one magnet and the at least one coil during operation of the object, and wherein at least one of the magnet supporting structure or the coil supporting structure is configured to be affixed to the object; and
   means for providing a restoring force to at least one of: the magnet supporting structure or the coil supporting structure, wherein the restoring force reduces the relative movement and causes at least one of: the magnet supporting structure or the coil supporting structure to move toward the fixed relative orientation during operation of the object.

2. The device of claim 1, in which the magnet supporting structure is connected to a bearing that allows the magnet supporting structure to maintain a substantially unchanged orientation while the rotating component moves.

3. The device of claim 1, wherein the object comprises a vehicle, and wherein the coil supporting structure is attached to a first component of a suspension of the vehicle and the magnet supporting structure is attached to a second component of the suspension, wherein the first component moves relative to the second component during operation of the vehicle.

4. The device of claim 1, in which the at least one magnet, the magnet supporting structure, the at least one coil, and the coil supporting structure are embodied in a generator, and wherein the means for providing includes a weighted pendulum connected to a shaft of the generator by a gearing mechanism, wherein the gearing mechanism converts motion of the pendulum into a higher rotational motion of the shaft.

5. The device of claim 1, further comprising means for varying an inductance of at least one of the at least one coil based on at least one attribute of a current performance of the device.

6. The device of claim 1, wherein the object oscillates in a plane of the coil supporting structure and the magnet supporting structure during operation.

7. The device of claim 1, in which the magnet supporting structure is pivotally attached to the coil supporting structure.

8. The device of claim 7, in which the magnet supporting structure maintains an orientation substantially similar to its original orientation, wherein the means for providing includes a weight attached to the magnet supporting structure.

9. The device of claim 1, wherein the means for providing includes the coil supporting structure comprising an enclosure whose bottom is curved, and in which the magnet supporting structure includes a set of guides on an interior of the bottom of the coil supporting structure, wherein the set of guides allow the at least one magnet to move with respect to the at least one coil.

10. The device of claim 9, in which the at least one magnet includes a plurality of magnets, the device further including means for maintaining an ideal separation of the plurality of magnets.

11. The device of claim 1, further comprising an electrical energy conversion circuit electrically connected to the at least one coil.

12. The device of claim 11, in which the electrical energy conversion circuit includes a rectification means to store electrical energy regardless of polarity.

13. The device of claim 12, in which the electrical energy conversion circuit contains devices capable of rectifying and storing electrical energy at very low voltages.

14. A vehicle including:
a device for energy harvesting from motion of the vehicle, the device comprising:
at least one magnet;
at least one coil;
a magnet supporting structure supporting the at least one magnet;
a coil supporting structure supporting the at least one coil, wherein the magnet supporting structure and the coil supporting structure have a fixed relative orientation when the vehicle is not in operation and enable relative movement between the at least one magnet and the at least one coil during operation of the vehicle, and wherein at least one of the magnet supporting structure or the coil supporting structure is affixed to the vehicle; and
means for providing a restoring force to at least one of: the magnet supporting structure or the coil supporting structure, wherein the restoring force reduces the relative movement and causes at least one of: the magnet supporting structure or the coil supporting structure to move toward the fixed relative orientation during operation of the vehicle.

15. The vehicle of claim 14, wherein the magnet supporting structure is attached to one of: a spring or a support of a suspension system of the vehicle and the coil supporting structure is attached to the other of the spring or the support of the suspension system.

16. A method for energy harvesting comprising:
generating relative movement between a magnet supporting structure and a coil supporting structure based on motion of an object to which the coil supporting structure is affixed, wherein at least one of the magnet supporting structure or the coil supporting structure is configured to provide a restoring force to maintain a relative difference in motion between the magnet supporting structure and the coil supporting structure without regard to resonant phenomena;
generating electrical energy based on the relative motion between at least one magnet corresponding to the magnet supporting structure and at least one coil corresponding to the coil supporting structure, wherein at least one coil corresponding to the coil supporting structure is configured to allow varying inductance;
a controller evaluating the relative motion based on the generating; and
the controller varying an inductance of the at least one coil to affect the relative motion in response to the evaluating.

17. The method of claim 16, in which the coil supporting structure is configured to rotate with respect to the magnet supporting structure in response to the motion of the object.

18. The method of claim 16, in which the coil supporting structure is configured to move substantially linearly with respect to the magnet supporting structure in response to the motion of the object.

19. The method of claim 16, in which the coil supporting structure is configured to move back and forth with respect to the magnet supporting structure in response to the motion of the object.

20. The method of claim 16, in which the magnet supporting structure and the coil supporting structure and at least one magnet and at least one coil are included in a generator having a rotor, wherein the rotor is configured to rotate based on a geared connection between the rotor and a weighted pendulum.

21. The method of claim 16,
wherein the controller evaluating includes calculating a motion of the at least one magnet.

* * * * *